United States Patent
Garrard et al.

(10) Patent No.: US 11,860,211 B2
(45) Date of Patent: Jan. 2, 2024

(54) SYSTEM FOR MONITORING A HIGH VOLTAGE ELECTRICAL SYSTEM IN A VEHICLE

(71) Applicant: Ford Global Technologies, LLC, Dearborn, MI (US)

(72) Inventors: Michael Robert Garrard, Chelmsford (GB); Christopher Michael John West, Essex (NL)

(73) Assignee: Ford Global Technologies, LLC, Dearborn, MI (US)

( * ) Notice: Subject to any disclaimer, the term of this patent is extended or adjusted under 35 U.S.C. 154(b) by 38 days.

(21) Appl. No.: 17/545,429

(22) Filed: Dec. 8, 2021

(65) Prior Publication Data
US 2023/0176104 A1 Jun. 8, 2023

(51) Int. Cl.
*B60L 3/00* (2019.01)
*G01R 31/00* (2006.01)
*G01R 19/165* (2006.01)
*B60L 50/51* (2019.01)

(52) U.S. Cl.
CPC ............ *G01R 31/007* (2013.01); *B60L 50/51* (2019.02); *G01R 19/16528* (2013.01)

(58) Field of Classification Search
CPC .. G01R 31/007; G01R 19/16528; B60L 50/51
See application file for complete search history.

(56) References Cited

U.S. PATENT DOCUMENTS

| | | | |
|---|---|---|---|
| 6,525,542 B2 | 2/2003 | Price | |
| 8,009,055 B2* | 8/2011 | Lindsey | ........... G01R 19/16542 340/662 |
| 10,525,915 B2 | 1/2020 | Sturza et al. | |
| 2007/0120694 A1* | 5/2007 | Lindsey | ........... G01R 19/16538 340/662 |
| 2011/0144840 A1 | 6/2011 | Ye et al. | |
| 2013/0082685 A1* | 4/2013 | Varland | ................ G01R 19/155 324/119 |

FOREIGN PATENT DOCUMENTS

CN 112558583 3/2021

* cited by examiner

*Primary Examiner* — Dominic E Hawkins
(74) *Attorney, Agent, or Firm* — Haley Guiliano LLP

(57) ABSTRACT

Systems and methods are described for monitoring a high voltage electrical system in a vehicle. An interface circuit is configured to provide isolation between a high voltage component of the vehicle and a control module. The interface circuit comprises a high voltage constant current source, a voltage threshold detector and an electrical isolation circuit. The high voltage constant current source is configured to receive an input at a first voltage from the high voltage component. The voltage threshold detector is configured to receive an output from the high voltage constant current source and to output a signal to indicate whether the voltage of the high voltage component is at, or below, a desired voltage. The electrical isolation circuit is configured to receive the output signal from the voltage threshold detector, decouple the output signal from the high voltage component and, in response to receiving the output signal from the voltage threshold detector, output a signal at a second voltage to the control module.

18 Claims, 8 Drawing Sheets

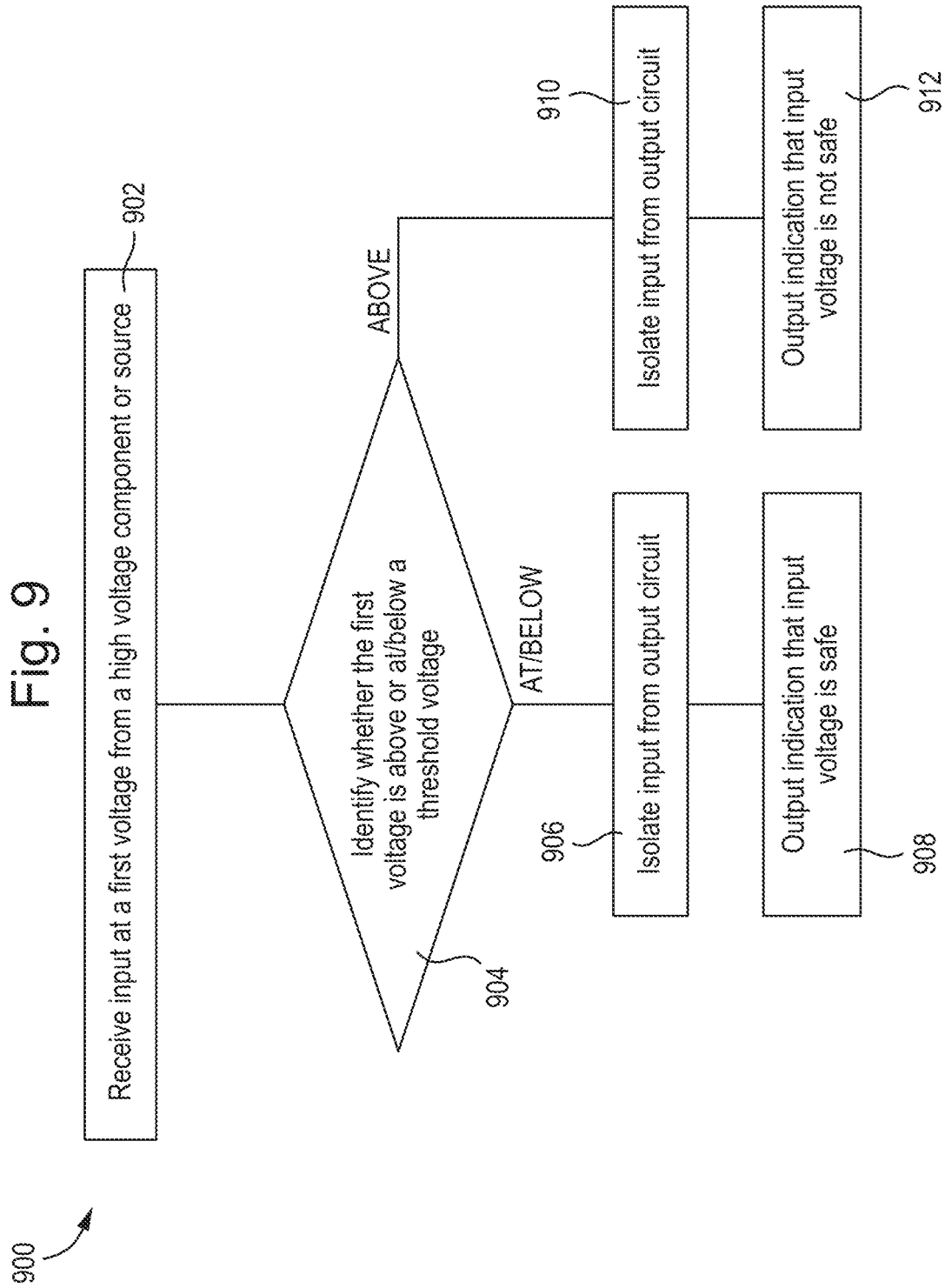

SYSTEM FOR MONITORING A HIGH VOLTAGE ELECTRICAL SYSTEM IN A VEHICLE

BACKGROUND

The present disclosure relates to systems and methods for monitoring a high voltage electrical system in a vehicle. More particularly, but not exclusively, the present disclosure relates to providing a system that outputs a signal when the high voltage electrical system is at a voltage below a threshold amount.

SUMMARY

Electric vehicles, such as those powered by batteries and/or fuel cells, use high voltages to reduce current and significantly increase efficiency of motors, batteries, wiring, direct current (DC) to DC converters and inverters that drive the motors. In the automotive industry, DC voltages above, for example, 60 V, may be classed as "high voltage". For example, high voltage busses may be 300 to 400 V and, in some examples, can be as high as 1500 V DC. High voltage systems may be designed to prevent direct contact from all such voltages, such as during maintenance, tampering by a user and/or a vehicle collision. High voltage relays called contactors may be used to isolate live high voltage parts.

For a vehicle powered by a high voltage traction battery, all the high voltage electrics may be in an enclosure and only the power terminals may need isolating. However, for vehicles powered by fuel cells (such as hydrogen and/or methane powered vehicles), the vehicle may comprise a compressor to pressurize a supply of air, relatively large cooling systems and a fuel supply from fuel tanks external to the fuel cell. It is more difficult to enclose the systems associated with vehicles powered by fuel cells, when compared to battery powered vehicles. For example, contactors and fuel injectors attach externally on the fuel cell stack. Additionally, there is no obvious boundary for a tamper proof enclosure and the control modules for fuel injection, cooling, fuel tanks and power distribution are usually remotely mounted and run off the 12 V battery (e.g., a low voltage system). In addition, there may be additional constraints with respect to vehicles powered by fuel cells, in that no high voltage lines can run from the high voltage fuel cell to the control electronics that are powered by a 12 V system. This differs from battery powered electric vehicles, where controls can reside inside the battery case.

In some examples, high voltage sensors may use a vehicle controller area network (CAN) communications over a galvanically isolated connection bus to indicate whether a high voltage system of the vehicle is at an expected voltage. However, such systems can be relatively complicated and expensive, as they require a high voltage detection circuit, a microcontroller and software to read, convert and report the results using the CAN protocol. In this example, isolation between the low voltage electronic circuit and the high voltage circuit may be achieved using a small transformer driven at high alternating current frequency, with a detection circuit on the isolated side that interfaces using the CAN standard.

Systems and methods are provided herein for monitoring a high voltage electrical system in a vehicle. For example, the systems and methods provided herein enable the provision of a system that outputs a signal when the high voltage electrical system is at a voltage below a threshold amount.

According to some examples of the systems and methods provided herein, a system for monitoring a high voltage electrical system in a vehicle is provided. An interface circuit configured to provide isolation between a high voltage component of the vehicle and a control module. The interface circuit comprises a high voltage constant current source, a voltage threshold detector and an electrical isolation circuit. The high voltage constant current source is configured to receive an input at a first voltage from the high voltage component. The voltage threshold detector is configured to receive an output from the high voltage constant current source and to output a signal to indicate whether the voltage of the high voltage component is at, or below, a desired voltage. The electrical isolation circuit is configured to receive the output signal from the voltage threshold detector, decouple the output signal from the high voltage component and, in response to receiving the output signal from the voltage threshold detector, output a signal at a second voltage to the control module. In another example, the interface circuit comprises a field effect transistor, a Zener diode and an opto-isolator. The field effect transistor may be configured to receive an input at a first voltage from the high voltage component. The Zener diode may be configured to receive an output from the field effect transistor. The opto-isolator may be configured to receive an output from the Zener diode, and, in response to receiving the output, output a signal at a second voltage to the control module. In some examples, the first voltage may be higher than the second voltage, in particular, the first voltage may be higher than 60 volts. In some examples, the voltage threshold detector is configured to cause the electrical isolation circuit to output a signal when the first voltage is higher than 60 volts. In some examples, the output signal from the voltage electrical isolation circuit may be a digital output signal. In an example system, an electric vehicle comprises a system for monitoring a high voltage electrical system of the vehicle. An output from a component of the high voltage electrical system is received by the interface circuit, is received by the field effect transistor and is transmitted to the Zener diode. The Zener diode is selected to implement a threshold voltage, such as a desired voltage of 60 V, wherein if the output that is received from the high voltage electrical system is at or below 60 V, it cannot pass through the Zener diode; however, if the output is above 60 V, it can pass through the Zener diode. The opto-isolator isolates the interface circuit and the high voltage system from any output and/or control circuit connected to the opto-isolator. The opto-isolator may be configured to output a digital signal indicating whether or not the component of the high voltage electrical system is at a desired voltage. For example, if the opto-isolator receives an input, this indicates that the input is above the threshold voltage, for example, 60 V, and that the component of the high voltage electrical system is not at a desired voltage. In this example, the opto-isolator may output a digital signal corresponding with a high voltage. For example, if the opto-isolator does not receive an input, this indicates that the input is below the threshold voltage, for example, 60 V, and that the component of the high voltage electrical system is at a desired voltage. In this example, the opto-isolator may output a digital signal corresponding to states of the presence of a voltage above or below the desired voltage.

In some examples, the system may be configured to provide a fast bus discharge. The system may comprise a switch in a path between the high voltage component and the monitoring part of the system. The switch may be located within a high voltage source, such as a battery enclosure.

External vehicle control modules supplied by the battery, such as a heating, ventilation, and air conditioning (HVAC) unit, might contain input capacitance on the same bus. The switch may be configured to open in response to a signal from the control module. The interface circuit may be connected to the wires now unpowered by the battery but held at high voltage by the capacitor. This voltage will be discharged by the interface circuit at the same time that the interface circuit reports whether the desired voltage has been reached. In some examples, the switch may be a contactor. In an example, this system may be used to discharge components of a high voltage electrical system that are not at a desired voltage to a desired voltage. The opto-isolator may be used in a similar manner to indicate when a threshold, for example, desired voltage of 60 V is achieved. A control system may be used to open and/or close the switch to discharge the high voltage component. The control system may monitor the output of the interface circuit for information about the bus voltage, for example, time taken to discharge.

In some examples, there may be provided a vehicle comprising the system for monitoring a high voltage electrical system. In some examples, the vehicle's electric motor may be powered by a battery. In some examples, the vehicle may be powered by a fuel cell.

It shall be appreciated that other features, aspects and variations of the present disclosure will be apparent from the disclosure of the drawings and detailed description. Additionally, it will be further appreciated that additional or alternative examples of methods of and systems for controlling an electrical accessory may be implemented within the principles set out by the present disclosure.

FIGURES

The above and other objects and advantages of the disclosure will be apparent upon consideration of the following detailed description, taken in conjunction with the accompanying drawings, in which:

FIG. 9 illustrates a flowchart of illustrative steps involved in a system for monitoring a high voltage electrical system, in accordance with some examples of the disclosure.

DETAILED DESCRIPTION

Figure 1:
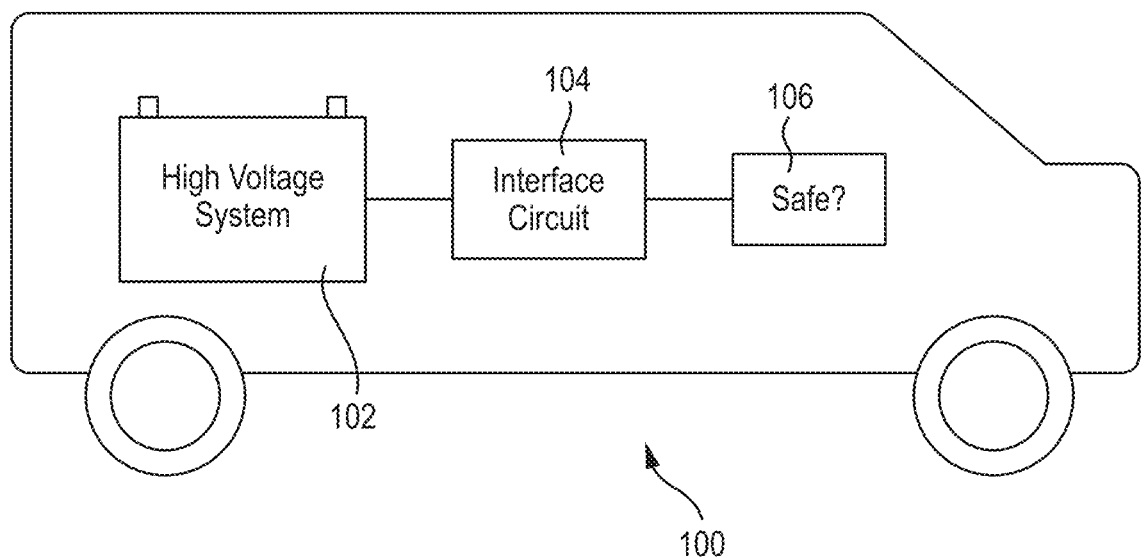
FIG. 1 illustrates an example environment in which there is provided a vehicle comprising a system for monitoring a high voltage electrical system, in accordance with some examples of the disclosure.

FIG. 1 illustrates an example environment in which there is provided a vehicle comprising a system for monitoring a high voltage electrical system, in accordance with some examples of the disclosure. In the example shown in FIG. 1, there is a vehicle 100. The vehicle 100 may be any type of automotive vehicle that is capable of being powered by a battery and/or a fuel cell, including, for example, a car, a motorcycle, a van, a lorry, a tractor and/or an aircraft. The vehicle 100 is powered by an energy source that comprises a high voltage system 102, for example, the vehicle 100 may be battery powered and/or powered by a fuel cell. The high voltage system 102 is in communication with an interface circuit 104 that, on detecting whether the high voltage system 102 is at a desired voltage, for example at or below 60 V, outputs a signal indicating that the high voltage system 102 is at a desired voltage. This signal is received by the control electronics 106 that, on receiving the signal from the interface circuit 104, outputs an indication that the high voltage system 102 is at a desired voltage.

Figure 2:
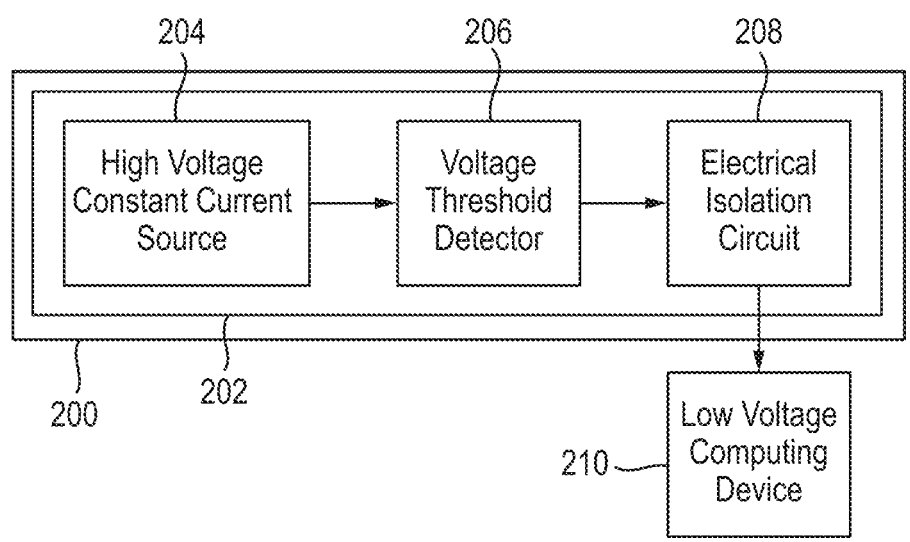
FIG. 2 illustrates a schematic circuit diagram of a system for monitoring a high voltage electrical system, in accordance with some examples of the disclosure.

FIG. 2 illustrates a schematic circuit diagram of a system for monitoring a high voltage electrical system, in accordance with some examples of the disclosure. The schematic is exemplary of the architecture, which comprises a high voltage domain 200, the high voltage domain 200 comprising an interface circuit 202, and the interface circuit 202 comprising a high voltage constant current source 204, a voltage threshold detector 206 and an electrical isolation circuit 208 to decouple the output signal from the high voltage. The interface circuit 202 is connected to a low voltage computing device 210 and the interface circuit 202 outputs a signal, indicative of whether the voltage at or below a desired voltage, to the low voltage computing device 210. In some examples, the interface circuit 202 and computing device 210 may be used to support diagnostics of components that might otherwise be difficult to diagnose, for example, low potential contactor or bus discharge circuitry. In another example, the interface circuit 202 and the computing device 210 may be used as a safety backup in-case of loss of communication with analog sensors on the system, such as voltage monitors.

Figure 3:
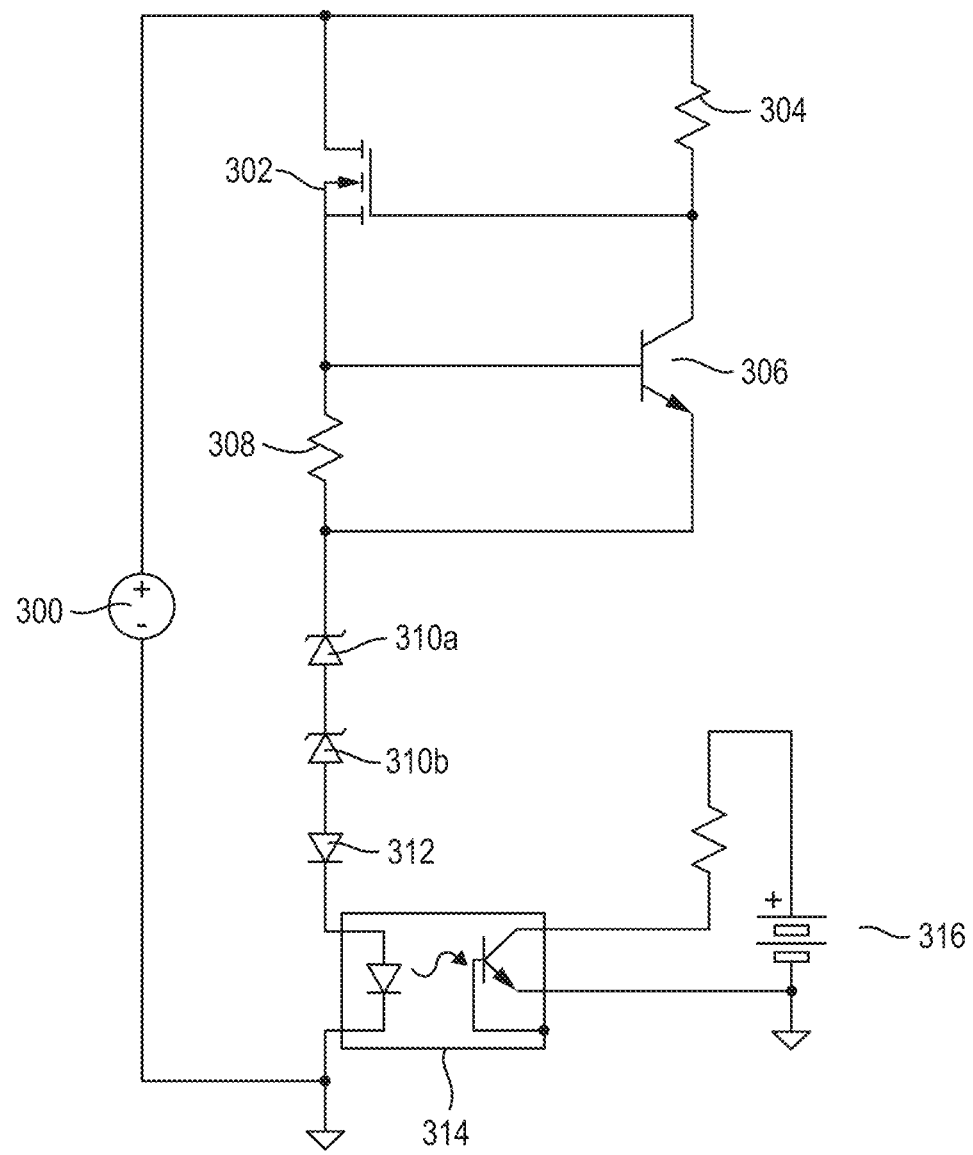
FIG. 3 illustrates another schematic circuit diagram of a system for monitoring a high voltage electrical system, in accordance with some examples of the disclosure.

FIG. 3 illustrates another schematic circuit diagram of a system for monitoring a high voltage electrical system, in accordance with some examples of the disclosure. The schematic is exemplary of the architecture, which comprises a high voltage constant current source (for example, 302, 304, 306, 308), a voltage threshold detector configured to output a signal indicating whether the voltage of a high voltage component is at, or below, a desired voltage (for example, 310a, 310b, 312), and an electrical isolation circuit to decouple the output signal from the high voltage (for example, 314, 316). A high voltage DC (i.e., the bus voltage) is produced at 300. The high voltage DC source is connected to a high voltage transistor 302, such as a high voltage field-effect transistor (FET) (e.g., a high voltage N-channel metal-oxide-semiconductor field-effect transistor (N-MOSFET)), that is capable of withstanding the high voltage received at 300, for example an N-MOSFET with a drain-source voltage of 1000 V. A resistor 304, such as a 2 Mega Ohm resistor, provides the gate voltage for the transistor 302. The gate voltage is controlled by a low voltage negative-positive-negative (NPN) bipolar junction transistor 306, e.g., so that the voltage drop across resistor 308 is a constant voltage, e.g., a voltage that falls between the base and the emitter of the bipolar junction transistor (Vbe). This constant voltage leads to a constant current, for example, approximately 5 mA. In this example circuit, there is a first 30 V Zener diode 310*a* and a second 20 V Zener diode 310*b* that, together, emulate a single 50 V Zener diode. In other examples, a single 50 V Zener diode may be used. In other examples, an arrangement that prevents current from flowing below a threshold voltage may be implemented instead of, or in addition to, a Zener diode, or diodes. In an example system, this threshold voltage may be any value lower than the bus voltage including between 50 V to 60 V. The voltage of the Zener diode sets a desired voltage of the high voltage system in the vehicle, below which it is indicated that the high voltage system is at, or below, a desired voltage. In some examples, for example, where a 50 V Zener diode is used, circuit tolerances are taken into account to ensure all circuits report at or below the desired voltage. The Zener diodes 310*a*, 310*b* are in communication with a diode 312 that protects the light emitting diode (LED) of opto-isolator 314 from reverse voltage in the case of rapid discharge of the bus. The opto-isolator 314 isolates the high voltage system from the control electronics 316 and provides a low-voltage digital output to the control electronics 316, when the voltage of the high voltage system is at, or below, a desired voltage.

Figure 4:
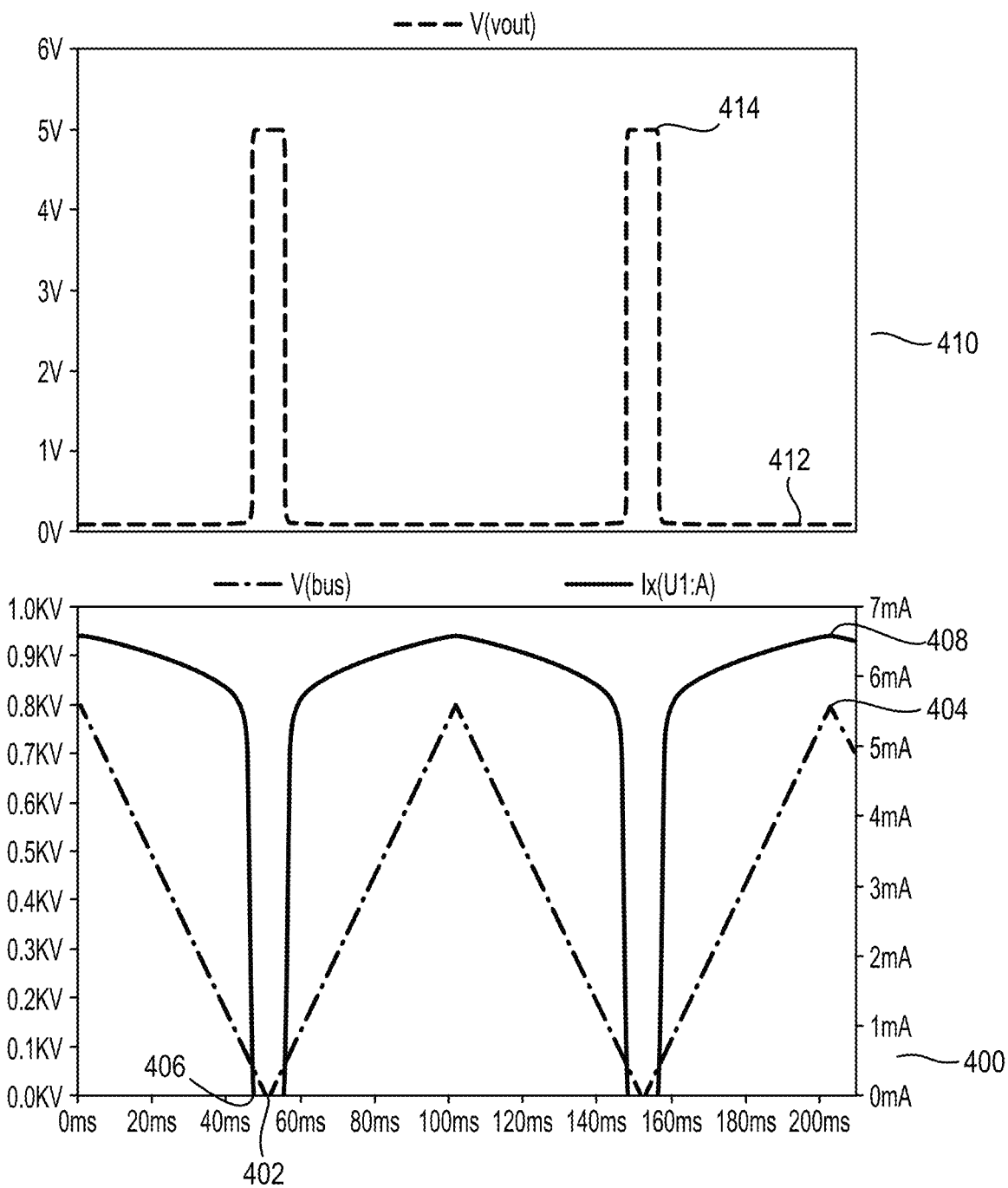
FIG. 4 illustrates a schematic graph of input and output voltages of a system for monitoring a high voltage electrical system, in accordance with some examples of the disclosure.

FIG. 4 illustrates a schematic graph of input and output voltages of a system for monitoring a high voltage electrical system, in accordance with some examples of the disclosure. The graph 400 depicts the bus voltage that ranges, for example, from 0 V 402 to 0.8 KV 404 (left axis) and the current through the opto-isolator LED that ranges, for example, from 0 A 406 to 6.5 mA 408 (right axis). When the bus voltage is at, or below, for example, 60 V, the current through the opto-isolator LED is zero and when the bus voltage is above, for example, 60 V, the current through the opto-isolator LED is, for example, 5.5 mA to 6.5 mA. The graph 410 depicts the digital output of the opto-isolator that ranges from, for example, ~0 V 412 to 5 V 414. The digital output corresponds to the current running through the LED, such that when the high voltage system is at, or below, for example, 60 V, a digital signal is output at the opto-isolator in conjunction with the pull-up resistor in the control module 316, indicating that the high voltage system is operating as desired, e.g., within an expected operating voltage range. If the high voltage system is above, for example, 60 V, the digital signal indicates the presence of high voltage in the high voltage system.

Figure 5:
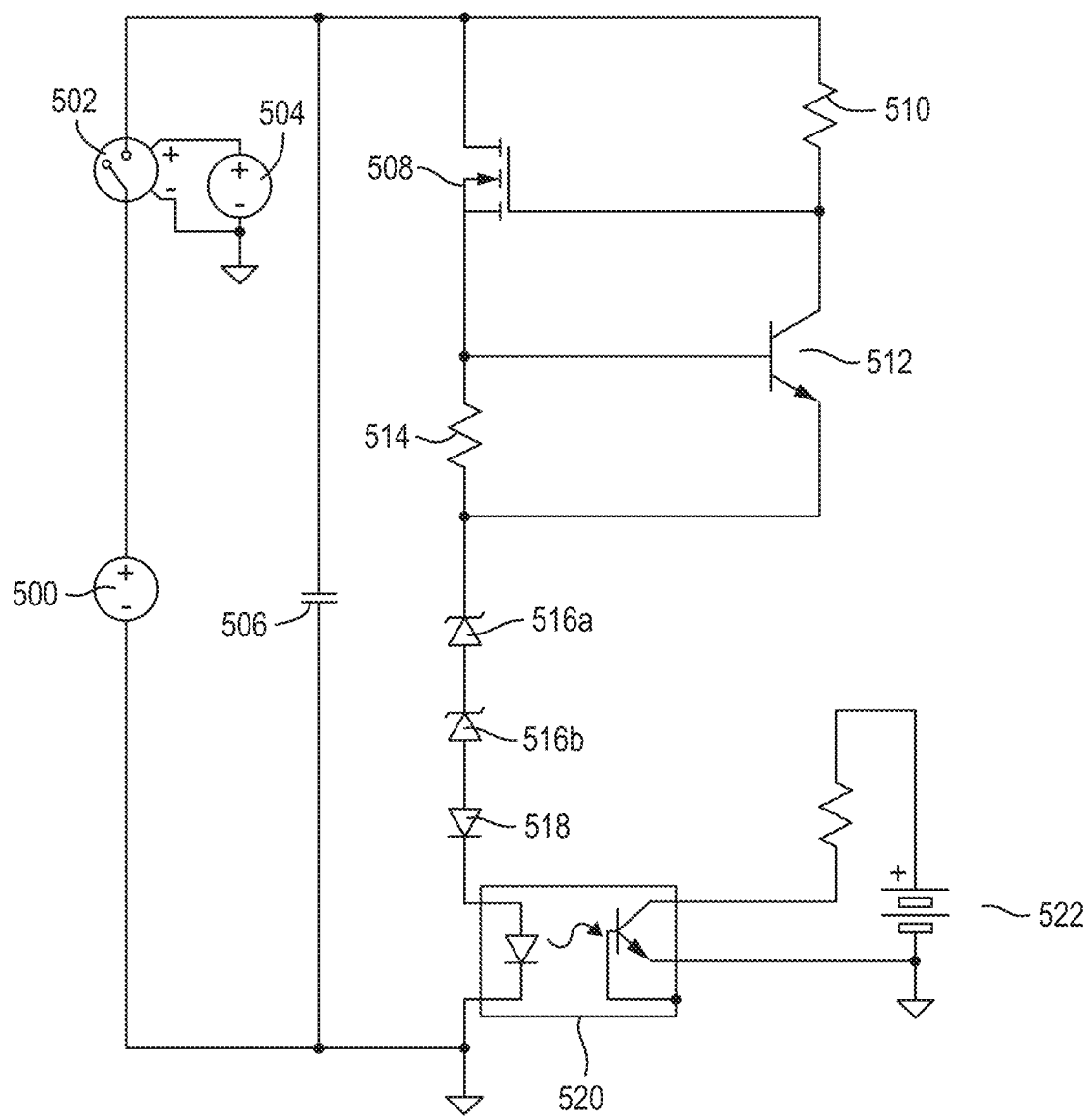
FIG. 5 illustrates a schematic circuit diagram of a system for monitoring a high voltage electrical system and configured to provide a fast bus discharge, in accordance with some examples of the disclosure.

FIG. 5 illustrates a schematic circuit diagram of a system for monitoring a high voltage electrical system and configured to provide a fast bus discharge, in addition to detection of the voltage state, in accordance with some examples of the disclosure. The circuit of FIG. 5 is broadly similar to that of FIG. 3. The schematic is exemplary of the architecture, which comprises a switch (for example, 502, 504), a high voltage constant current source (for example, 508, 510, 512, 514), a voltage threshold detector configured to output a signal indicating whether the voltage of a high voltage component is at, or below, a desired voltage (for example, 516*a*, 516*b*, 518), and an electrical isolation circuit to decouple the output signal from the high voltage (for example, 520, 522). As before, a high voltage DC (i.e., the bus voltage) is produced at 500, and the high voltage DC source 500 is connected to a high voltage transistor 508. Again, a resistor 510 provides the gate voltage for the transistor 508. The gate voltage is controlled by a low voltage NPN bipolar junction transistor 512 so that the voltage drop across resistor 514 is a constant Vbe. This constant voltage leads to a constant current, for example, approximately 5 mA. In this example circuit, there is a first 30 V Zener diode 516*a* and a second 20 V Zener diode 516*b* that, together, emulate a single 50 V Zener diode. The Zener diodes 516*a*, 516*b* are in communication with a diode 518 that protects the light emitting diode (LED) of opto-isolator 520 from reverse voltage in the case of rapid discharge of the bus. The opto-isolator 520 isolates the high voltage system from the control electronics 522 and provides a low-voltage digital output to the control electronics 522, when the voltage of the high voltage system is at, or below, a desired voltage. In addition, a contactor 502 and a bus capacitor 506 have been added to the circuit. The contactor is opened and closed via power circuit 504. The contactor switch is arranged to open at, for example, time=1 second. On opening the switch, the circuit discharges the capacitor 506 using a constant, for example, 5 mA. The control circuit 522 may be configured to open the contactor and, for example, may be used to determine the discharge duration and whether a desired voltage is present via the opto-isolator 520.

Figure 6:
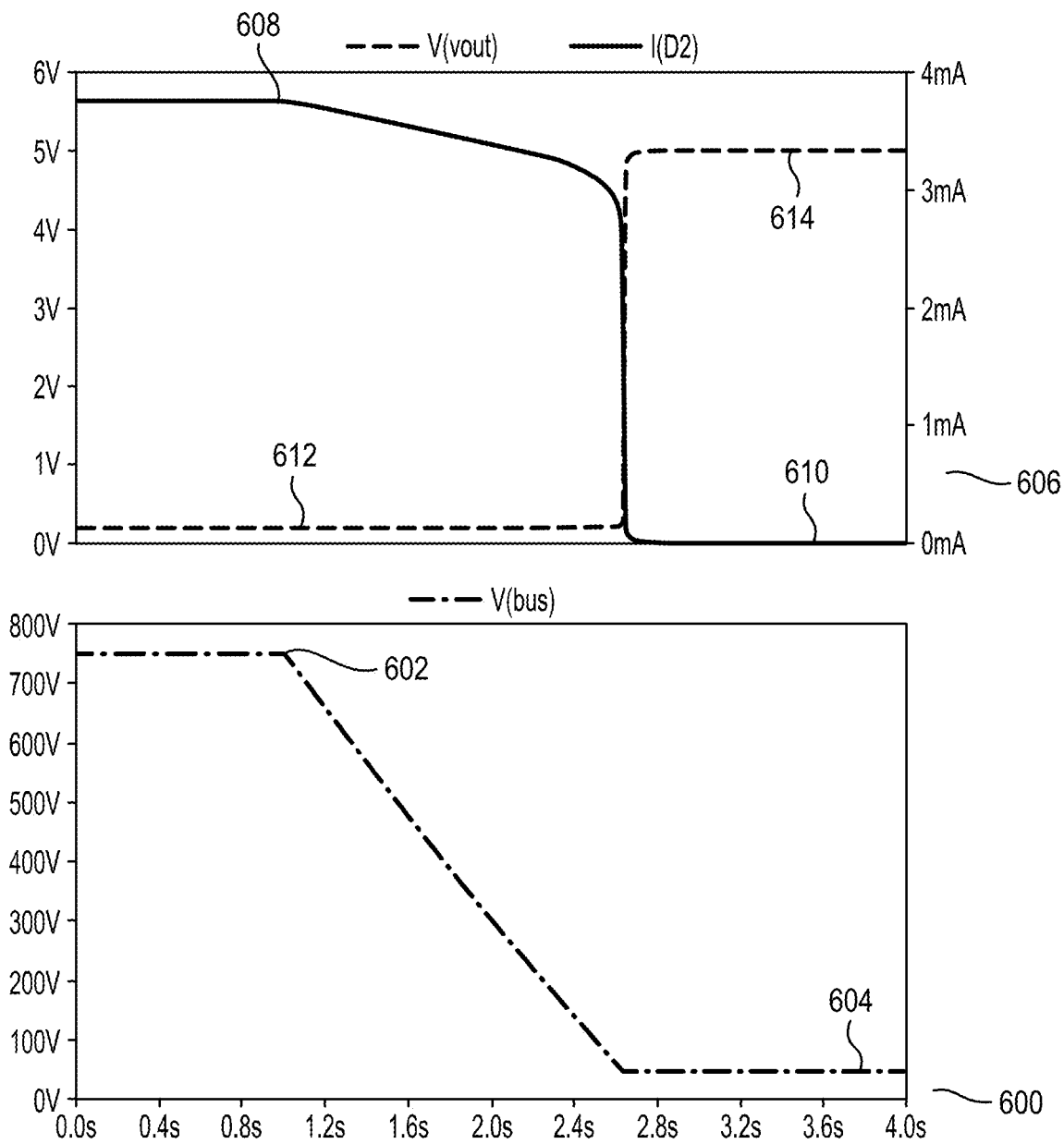
FIG. 6 illustrates a schematic graph of input and output voltages of a system for monitoring a high voltage electrical system and configured to provide a fast bus discharge, in accordance with some examples of the disclosure.

FIG. 6 illustrates a schematic graph of input and output voltages of a system for monitoring a high voltage electrical system and configured to provide a fast bus discharge, in accordance with some examples of the disclosure. Graph 600 shows the bus voltage falling from, for example, 750 V 602 to 45 V 604 over, for example, 1.6 seconds. In this example, the contactor is opened at 1 seconds, which is when the voltage starts falling as the voltage is discharged. The graph 606 depicts the current through the opto-coupler falling from, for example, 3.8 mA 608 to 0 mA 610 as the circuit discharges. The output signal from the opto-coupler increases from, for example, ~0 V 612 to 5 V 614, indicating that circuit has discharged to a desired voltage. As can be seen, the digital output only indicates that the circuit has discharged to a desired voltage when the voltage reaches a threshold amount, such as, in this example, 45 V.

Figure 7:
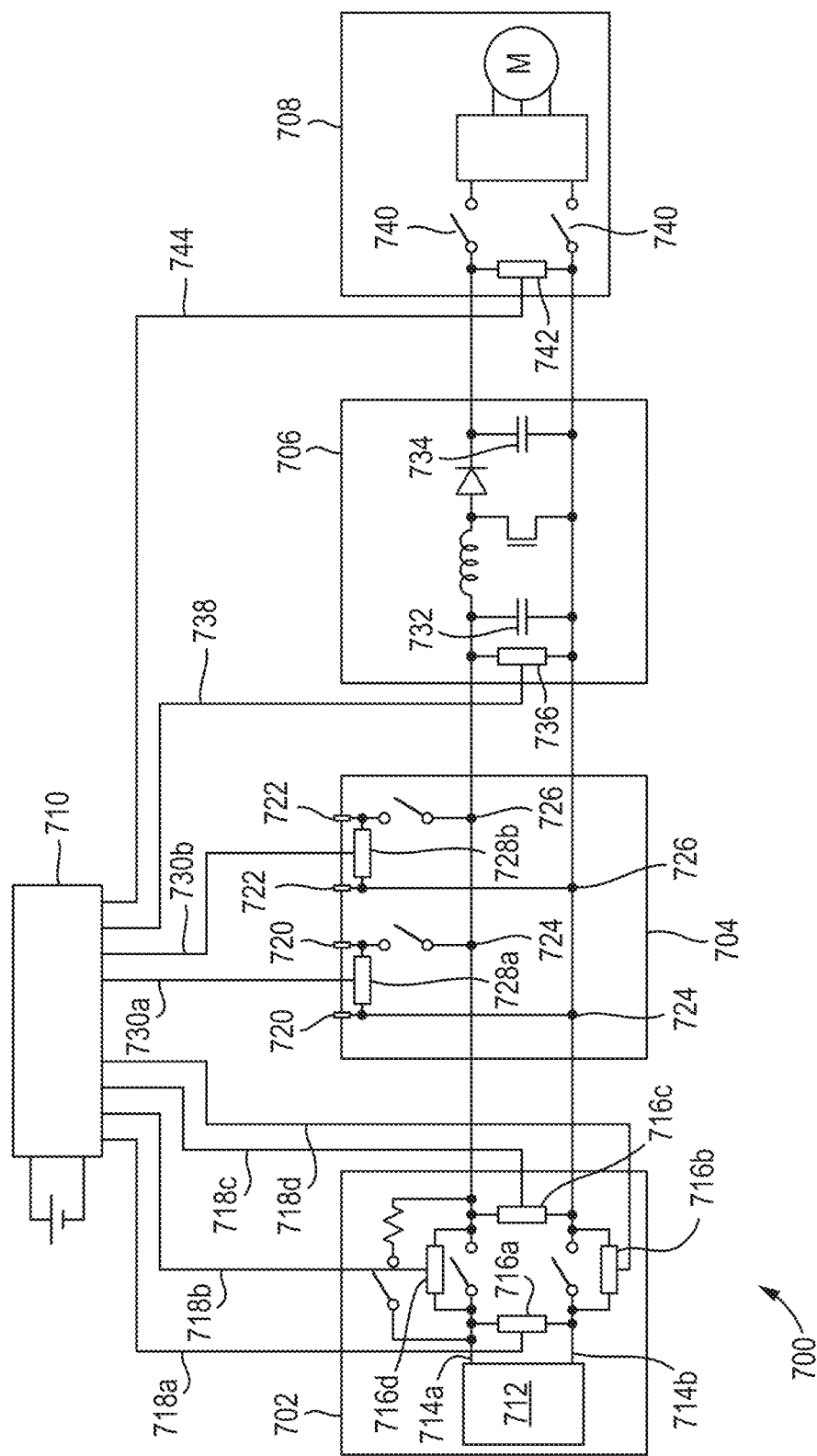
FIG. 7 illustrates a schematic high voltage architecture, in accordance with some examples of the disclosure.

FIG. 7 illustrates a schematic high voltage architecture, in accordance with some examples of the disclosure. High voltage architecture 700 comprises a high voltage module 702, a battery electric center (BEC) 704, a step-up DC-DC module 706, an electric motor and invertor 708 and a high voltage control module 710. Components within these modules are monitored by interface circuits, such as those described in connection with FIGS. 2 and 3 above, that output an isolated low voltage digital signal, indicating whether the voltage of the high voltage component is at, or below, a desired voltage, to the high voltage control module 710.

The high voltage module 702 comprises a high voltage source 712, high voltage connections 714*a*, 714*b*, and interface circuit components 716*a*, 716*b*, 716*c*, 716*d* that each output an isolated low voltage digital supply signal 718*a*, 718*b*, 718*c*, 718*d*, indicating whether the voltage of the high voltage component is at, or below, a desired voltage, to the high voltage control module 710. In this example, the interface circuit components 716*a*, 716*b*, 716*c*, 716*d* monitor the high voltage source, the pre-charge components and the switches associated with the high voltage module 702.

The BEC 704 comprises an accessory output 720 and a charging input 722 that are connected 724, 726 to the high voltage connection. The interface circuit components 728*a*, 728*b* monitor the accessory output 720 and the charging input 722 and output an isolated low voltage digital supply signal 730*a*, 730*b*, indicating whether the voltage of the high voltage component is at, or below, a desired voltage, to the high voltage control module 710.

The step-up DC-DC module 706 comprises an input capacitance 732 and an output capacitance 734 connected to the high voltage connections. An interface circuit component 736 monitors the components and outputs an isolated low voltage digital supply signal 738, indicating whether the voltage of the high voltage component is at, or below, a desired voltage, to the high voltage control module 710. The interface circuit may also perform the role of bus discharge to render the system safe for maintenance work.

The electric motor and inverter 708 are connected 740 to the high voltage connectors and are monitored by an interface circuit component 742. The interface circuit component monitors the electric motor and inverter and outputs an isolated low voltage digital supply signal 744, indicating whether the voltage of the high voltage component is at, or below, a desired voltage, to the high voltage control module 710. The interface circuit may also perform the role of bus discharge to render the system safe for maintenance work.

In some examples, the output from the interface circuit may be used as a secondary signal to validate other sensors on a high voltage system.

Figure 8:
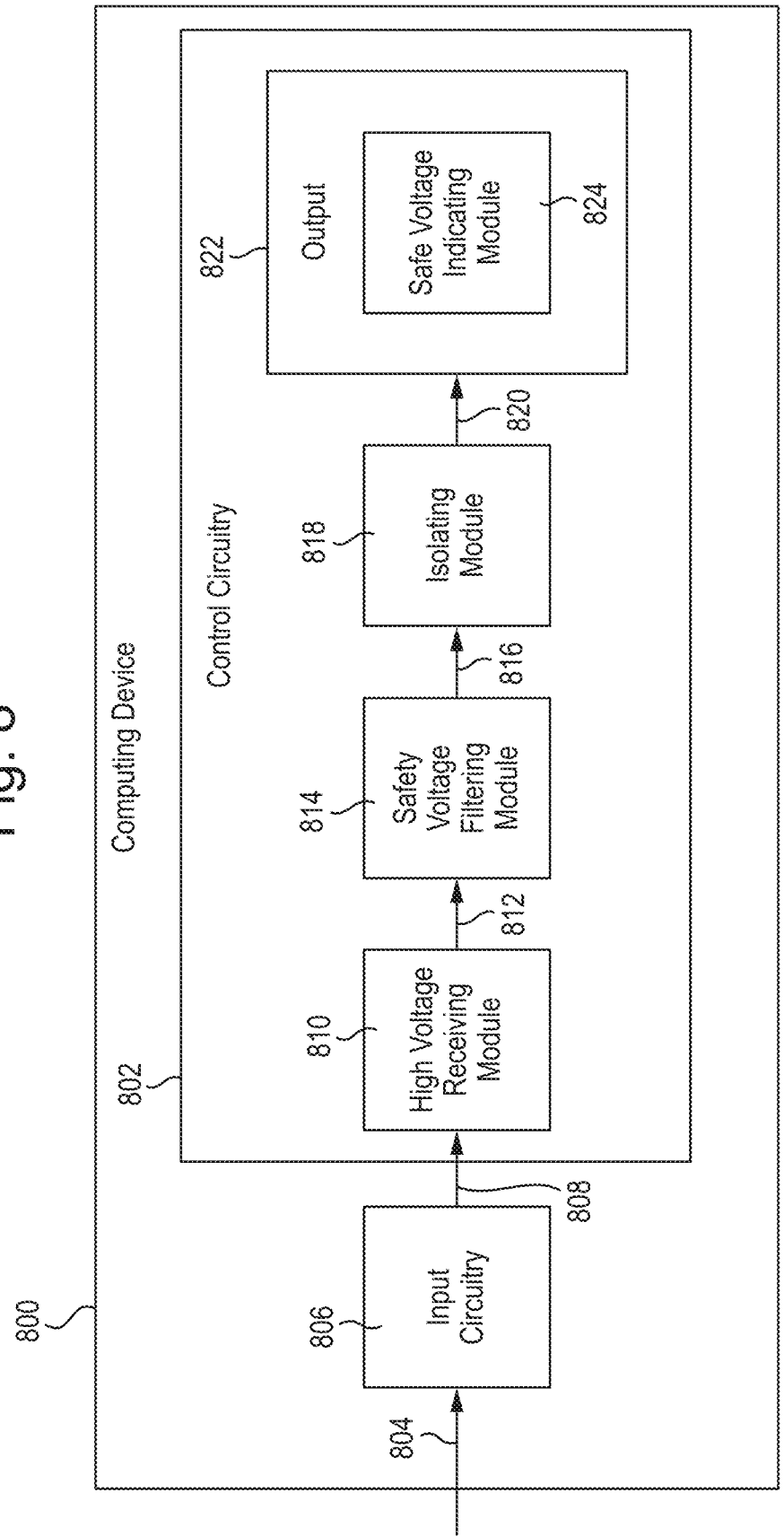
FIG. 8 illustrates a block diagram representing components of a computing device and data flow therebetween for a system for monitoring a high voltage electrical system, in accordance with some examples of the disclosure.

FIG. 8 illustrates a block diagram representing components of a computing device and data flow therebetween for a system for monitoring a high voltage electrical system, in accordance with some examples of the disclosure. Computing device 800 comprises control circuitry 802, input circuitry 806, and an output module 822. Control circuitry 802 may be based on any suitable processing circuitry (not shown) and may comprise control circuits and memory circuits, which may be disposed on a single integrated circuit or may be discrete components and processing circuitry. Some control circuits may be implemented in hardware, firmware, or software.

An input 804, for example, an input from a high voltage component of a vehicle, is received at the input circuitry 806 and is transmitted 808 to the control circuitry 802. The control circuitry 802 comprises a high voltage receiving module 810, a voltage filtering module 814, an isolating module 818 and an output module 822. At the high voltage receiving module 810, an input is received and is transmitted 812 to the voltage filtering module 814. At the voltage filtering module 814, an output is transmitted 816 to the isolating module 818, if the received voltage is above a threshold amount (i.e., a desired voltage). If the received voltage is below the threshold amount, the voltage filtering module 814 does not transmit an output to the isolating module 818. At the isolating module 818 the presence, or lack of, an input is used to determine whether to output a digital signal indicating whether the input 804 is at a desired voltage. If the input 804 is at a desired voltage, the isolating module 818 transmits 820 a digital signal to the output module 822 where the desired voltage indicating module 824 generates an output indicating that the input (and hence the, for example, high voltage component) is at a threshold voltage, such as, for example, a desired voltage of 60 V.

FIG. 9 illustrates a flowchart of illustrative steps involved in a system for monitoring a high voltage electrical system, in accordance with some examples of the disclosure. In some examples, process 900 may run on a computing device. In other examples, process 900 may be implemented in discrete circuitry. At 902 an input at a first voltage is received from a high voltage component. At 904, it is identified whether the first voltage is above or at/below a threshold voltage, for example, a desired voltage of 60 V. If the voltage is at/below the threshold voltage, the input is isolated from the output circuit 906 and at 908 a digital signal is generated that indicates that the input voltage is desired. If the voltage is above the threshold voltage, the input is isolated from the output circuit 910 and at 912 a digital signal is generated that indicates that the input voltage is not desired.

While the present disclosure is described with reference to particular example applications, it will be appreciated that the disclosure is not limited hereto and that particular combinations of the various features described and defined in any aspects can be implemented and/or supplied and/or used independently. It will be apparent to those skilled in the art that various modifications and improvements may be made without departing from the scope and spirit of the present disclosure. Those skilled in the art would appreciate that the actions of the processes discussed herein may be omitted, modified, combined, and/or rearranged, and any additional actions may be performed without departing from the scope of the disclosure.

Any system features as described herein may also be provided as a method feature and vice versa. As used herein, means plus function features may be expressed alternatively in terms of their corresponding structure. It shall be further appreciated that the systems and/or methods described above may be applied to, or used in accordance with, other systems and/or methods.

Any feature in one aspect may be applied to other aspects, in any appropriate combination. In particular, method aspects may be applied to system aspects, and vice versa. Furthermore, any, some and/or all features in one aspect can be applied to any, some and/or all features in any other aspect, in any appropriate combination.

The invention claimed is:

1. A system for monitoring a high voltage electrical system in a vehicle, the system comprising:
   an interface circuit configured to provide isolation between a high voltage component of the vehicle and a control module, wherein the interface circuit comprises:
   a high voltage constant current source comprising a field effect transistor configured to receive an input at a first voltage from the high voltage component;
   a voltage threshold detector comprising a Zener diode, the Zener diode configured to receive an output from the field effect transistor and to output a signal to indicate whether the voltage of the high voltage component is at, or below, a desired voltage; and
   an electrical isolation circuit comprising an opto-isolator, wherein:
   the opto-isolator is configured to receive the output signal from the Zener diode;
   the electrical isolation circuit is configured to decouple the output signal from the high voltage component; and
   in response to receiving the output signal from the Zener diode, the opto-isolator is configured to output a signal at a second voltage to the control module.

2. The system of claim 1, wherein the first voltage is higher than the second voltage.

3. The system of claim 1 configured to provide a fast bus discharge, wherein the system further comprises:
   a switch in a path between the high voltage component and the interface circuit, wherein the switch is configured to open in response to a signal from the control module; and
   a capacitor configured to be discharged by the interface circuit.

4. The system of claim 3, wherein the switch is a contactor.

5. The system of claim 1, wherein the voltage threshold detector is configured to cause the electrical isolation circuit to output a signal when the first voltage is higher than 60 volts.

6. The system of claim 1, wherein the output signal from the electrical isolation circuit is a digital output signal.

7. A vehicle comprising the system for monitoring a high voltage electrical system of claim 1.

8. The system of claim 7, wherein the vehicle is powered by a battery and an electric motor.

9. The system of claim 7, wherein the vehicle is powered by a fuel cell.

10. A method for monitoring a high voltage electrical system in a vehicle using an interface circuit that provides isolation between a high voltage component of the vehicle and a control module, the method comprising:
   receiving, at a field effect transistor of a high voltage constant current source, an input at a first voltage from the high voltage component;
   receiving, at a Zener diode of a voltage threshold detector, an output from the field effect transistor, and outputting a signal to indicate whether the voltage of the high voltage component is at, or below, a desired voltage; and
   receiving, at an opto-isolator of an electrical isolation circuit, the output signal from the Zener diode, decoupling, at the electrical isolation circuit, the output signal from the high voltage component and, in response to receiving the output signal from the Zener diode, outputting, at the opto-isolator, a signal at a second voltage to the control module.

11. The method of claim 10, wherein the first voltage is higher than the second voltage.

12. The method of claim 10, wherein the interface circuit to provides a fast bus discharge, the method further comprising:
   opening a switch in a path between the high voltage component and the interface circuit in response to a signal from the control module; and
   discharging a capacitor by the interface circuit.

13. The method of claim 12, wherein the switch is a contactor.

14. The method of claim 10, wherein the voltage threshold detector is configured to cause the electrical isolation circuit to output a signal when the first voltage is higher than 60 volts.

15. The method of claim 10, wherein the output signal from the electrical isolation circuit is a digital output signal.

16. The method of claim 10, wherein the vehicle is powered by a battery and an electric motor.

17. The method of claim 10, wherein the vehicle is powered by a fuel cell.

18. A non-transitory, computer-readable, medium having non-transitory, computer-readable instructions encoded thereon for monitoring a high voltage electrical system in a vehicle using an interface circuit that provides isolation between a high voltage component of the vehicle and a control module that, when executed by control circuitry cause the control circuitry to:
   receive, at a field effect transistor of the interface circuit, an input at a first voltage from the high voltage component;
   receive, at a Zener diode of the interface circuit, an output from the field effect transistor; and
   receive, at an opto-isolator of the interface circuit, an output from the Zener diode, and, in response to receiving the output, output a signal at a second voltage to the control module.

* * * * *